(12) United States Patent
Rita

(10) Patent No.: US 7,186,461 B2
(45) Date of Patent: Mar. 6, 2007

(54) GLASS-CERAMIC MATERIALS AND ELECTRONIC PACKAGES INCLUDING SAME

(75) Inventor: Robert A. Rita, Manlius, NY (US)

(73) Assignee: Delaware Capital Formation, Inc., Wilmington, DE (US)

(*) Notice: Subject to any disclaimer, the term of this patent is extended or adjusted under 35 U.S.C. 154(b) by 0 days.

(21) Appl. No.: 11/084,718

(22) Filed: Mar. 18, 2005

(65) Prior Publication Data

US 2005/0266251 A1 Dec. 1, 2005

Related U.S. Application Data

(60) Provisional application No. 60/585,743, filed on Jul. 6, 2004, provisional application No. 60/574,828, filed on May 27, 2004.

(51) Int. Cl.
*B32B 17/06* (2006.01)
(52) U.S. Cl. .......................... 428/426; 501/4
(58) Field of Classification Search ................ 428/210, 428/426, 432, 433; 257/701
See application file for complete search history.

(56) References Cited

U.S. PATENT DOCUMENTS

| | | | |
|---|---|---|---|
| 4,301,324 A | 11/1981 | Kumar et al. | |
| 4,413,061 A | 11/1983 | Kumar et al. | |
| 4,576,922 A | 3/1986 | O'Brien et al. | |
| 4,598,167 A | 7/1986 | Ushifusa et al. | |
| 4,687,749 A | 8/1987 | Beall | |
| 4,761,325 A | 8/1988 | Kurihara et al. | |
| 4,764,233 A | 8/1988 | Ogihara et al. | |
| 4,777,092 A | 10/1988 | Kawakami et al. | |
| 4,849,379 A | 7/1989 | McCormick | |
| 4,849,380 A | 7/1989 | Sawhill | |
| 4,883,705 A | 11/1989 | Kawakami et al. | |
| 4,997,698 A | 3/1991 | Oboodi et al. | |
| 5,073,180 A | 12/1991 | Farooq et al. | |
| 5,242,867 A | 9/1993 | Lin et al. | |
| 5,256,469 A | 10/1993 | Cherukuri et al. | |
| 5,258,335 A | 11/1993 | Muralidhar et al. | |
| 5,277,724 A | 1/1994 | Prabhu | |
| 5,283,104 A | 2/1994 | Aoude et al. | |
| 5,304,518 A * | 4/1994 | Sunahara et al. | 501/62 |
| 5,337,475 A | 8/1994 | Aoude et al. | |
| 5,342,674 A | 8/1994 | Tanei et al. | |
| 5,468,694 A | 11/1995 | Taguchi et al. | |

(Continued)

OTHER PUBLICATIONS

U.S. Appl. No. 11/084,722, filed Mar. 18, 2005, Rita.

*Primary Examiner*—Jennifer C. McNeil
*Assistant Examiner*—Elizabeth D. Ivey
(74) *Attorney, Agent, or Firm*—Burr & Brown

(57) ABSTRACT

A glass-ceramic is provided having a thermal expansion coefficient in a range of 4.0 to 8.5 ppm/° C., a dielectric constant in a range of 5–7 and a Quality factor Q of at least 400. The glass-ceramic consists essentially of $SiO_2$ in a range of 40–55 wt %, $Al_2O_3$ in a range of 7–22 wt %, MgO in a range of 6 to less than 26 wt %, and at least one of BaO in an amount up to 35 wt %, SrO in an amount up to 37 wt % and ZnO in an amount up to 17 wt %. An electronic package is also provided, including one of a metal and sintered ceramic base member and a glass-ceramic substrate bonded to the base member.

17 Claims, 2 Drawing Sheets

U.S. PATENT DOCUMENTS

| | | |
|---|---|---|
| 5,476,821 A | 12/1995 | Beall et al. |
| 5,514,451 A | 5/1996 | Kumar et al. |
| 5,525,855 A | 6/1996 | Gotoh et al. |
| 5,581,876 A | 12/1996 | Prabhu et al. |
| 5,658,835 A | 8/1997 | Onitani et al. |
| 5,725,808 A | 3/1998 | Tormey et al. |
| 5,744,208 A | 4/1998 | Beall et al. |
| 5,847,935 A | 12/1998 | Thaler et al. |
| 5,877,101 A | 3/1999 | Terai |
| 5,889,322 A | 3/1999 | Hamada et al. |
| 5,910,459 A | 6/1999 | Beall et al. |
| 5,958,807 A | 9/1999 | Kumar et al. |
| 5,968,857 A | 10/1999 | Pinckney |
| 5,998,036 A | 12/1999 | Stein et al. |
| 6,017,642 A | 1/2000 | Kumar et al. |
| 6,120,906 A | 9/2000 | Terashi |
| 6,121,173 A | 9/2000 | Terashi |
| 6,124,223 A | 9/2000 | Beall et al. |
| 6,232,251 B1 | 5/2001 | Terashi et al. |
| 6,245,411 B1 | 6/2001 | Goto et al. |
| 6,300,262 B1 | 10/2001 | Beall |
| 6,303,527 B1 | 10/2001 | Pinckney |
| 6,344,423 B2 | 2/2002 | Goto et al. |
| 6,362,119 B1 | 3/2002 | Chiba |
| 6,372,376 B1 | 4/2002 | Fronk et al. |
| 6,372,676 B1 | 4/2002 | Kishida et al. |
| 6,376,055 B1 | 4/2002 | Kishida et al. |
| 6,455,930 B1 | 9/2002 | Palanisamy et al. |
| 6,739,047 B2 | 5/2004 | Hammond et al. |
| 2001/0029228 A1* | 10/2001 | Terashi .................. 501/32 |

\* cited by examiner

GLASS-CERAMIC MATERIALS AND ELECTRONIC PACKAGES INCLUDING SAME

CROSS REFERENCE TO RELATED APPLICATIONS

This application claims the benefit of U.S. Provisional Application Ser. No. 60/574,828 filed May 27, 2004 and U.S. Provisional Application Ser. No. 60/585,743 filed Jul. 6, 2004, the entireties of which are incorporated herein by reference.

This application is related to copending U.S. patent application Ser. No. 11/084,722, filed Mar. 18, 2005, entitled "LOW LOSS GLASS-CERAMIC MATERIAL, METHOD OF MAKING SAME AND ELECTRONIC PACKAGES INCLUDING SAME," which claims the benefit of U.S. Provisional Application Ser. No. 60/585,689 filed Jul. 6, 2004, the entireties of which are incorporated herein by reference.

FIELD OF THE INVENTION

The present invention relates to glass-ceramic materials for use in high frequency (i.e., gigahertz range) electronic applications and various ceramic packaging assemblies including glass-ceramic materials for use in high frequency electronic applications.

BACKGROUND OF THE INVENTION

Known multi-layered ceramic circuit boards are typically fabricated by forming layered stacks of ceramic dielectric tape, which are typically known as green tapes or green sheets. The green tapes typically comprise a ceramic material powder and/or glass powder that is mixed with suitable organic binders or resins, solvents, plasticizers and surfactants and formed into a tape. The process for making high density multi-layer circuit boards typically involves forming a plurality of pre-fabricated green tape layers having via holes punched therein, applying or printing circuit patterns on the layers using a conductive ink, i.e., a mixture of a conductive metal powder and a non-metallic powder including a glass and/or a ceramic in a solvent/binder mixture, filling the vias with the conductive ink so that the various circuit layers can be connected to one another through the thickness of the circuit board, and laminating the green tape layers together by pressing the layers into a stack. The stacked layers are then fired at a temperature exceeding 700° C. to burn off organic materials and to densify the green tape material to form a sintered glass and/or ceramic.

The sintered glass and/or ceramic circuit boards are typically quite fragile, however, and in order to impart additional mechanical strength to the laminated board, the circuit boards are often attached to one or both sides of a suitable support substrate, or core material. In addition, it may be desired to mount active, heat generating devices such as integrated circuits onto a high thermal conductivity member made of a metal or certain ceramics (e.g., AlN, SiC, etc.). In such situations, the glass and/or ceramic substrates are typically joined to the support structure via a solder-type bonding procedure, which is performed at low temperatures that are much less than the sintering temperature of the glass and/or ceramic substrate.

It is also possible to join a green laminated structure with a support member or other component before the green laminate is sintered. That is, the green laminated structure is adhered to a support member and the structure is then fired to a temperature that is sufficient to (1) remove the organic materials from the green tapes and the conductive inks, (2) sinter or densify the particles of the green tape composition and the metal particles of the conductive inks to form a sintered multi-layer ceramic and/or glass body, and (3) sufficiently adhere the sintered multi-layer body to the support substrate.

In both co-fired and non-co-fired cases, once bonding and densification have occurred, it is important that the sintered multi-layer body and the support structure have reasonably compatible thermal expansion characteristics, preferably closely matched thermal expansion coefficients. In most cases, however, the thermal expansion coefficient (hereinafter TEC) of the glass and/or ceramic laminate material does not closely match that of the support substrate or core on which the laminates are provided.

This thermal expansion mismatch problem is an important issue with low temperature co-fired ceramics (herein after LTCC) that are common in ceramic packaging applications, where a green laminated structure is sintered at a relatively low temperature after first being adhered to the metal support core. For example, densification of the green laminated structures during sintering can produce a large degree of volume shrinkage in the ceramic and/or glass material, for example, up to about 35–55 percent by volume. If the green laminated body is effectively bonded to an already dense support substrate or core (i.e., a core that does not itself shrink during the sintering process), the green laminated body will be constrained from sintering in the plane of the support substrate/core, which itself does not typically experience densification shrinkage when subjected to the typical sintering temperatures. This can create stresses which will be accentuated by the different expansion behaviors of the glass and/or ceramic substrate and the support member, both during the bonding process and in subsequent use in a thermally active environment.

The difference between the TEC of the material of the multi-layer substrate and that of the support substrate or core can, indeed, lead to substantial problems. For example, significant stresses can develop, particularly at the bonding interface, that lead to warping or other mechanical damage, such as non-adherence to the support substrate and misalignment between vias that are provided in the multi-layered body and the corresponding electrical feed-throughs provided on the support substrate or core. In severe cases, it is possible that the multi-layer substrate will even separate from the support, thus rendering the device unacceptable for use.

Most conventional, commercially available LTCC tapes have a TEC on the order of 6 to 8 ppm/° C. This often does not closely match the TEC of commonly used support cores, including laminated Copper-Molybdenum-Copper support cores, Copper-Molybdenum-Copper support cores that are produced by powder metallurgy techniques, and KOVAR® support cores.

For example, a typical laminated Cu/Mo/Cu (13/74/13) support core has a TEC from room temperature to 300° C. (hereinafter $\alpha_{RT-300}$) of about 5.3 ppm/° C. and a TEC from room temperature to 600° C. (hereinafter $\alpha_{RT-600}$) of about 5.6 ppm/° C. When plated with Ni, the laminated Cu/Mo/Cu (13/74/13) support core has an $\alpha_{RT-300}$ of about 5.75 ppm/° C. and an $\alpha_{RT-600}$ of about 5.8 ppm/° C. For KOVAR®, the $\alpha_{RT-300}$ is about 5 ppm/° C.

It is also important that the TEC of the sintered multi-layer glass and/or ceramic substrate closely matches that of the structure to which it is bonded in applications where the multi-layer glass and/or ceramic substrate is bonded to a metal support core after being sintered. A close TEC match is also desirable in stand-alone substrate applications, where the multi-layer glass and/or ceramic substrate is bonded to, or installed in connection with, another member or device, as mentioned above. That is, it is desirable to prevent thermal and mechanical stresses from arising when the final structure is used in the intended applications, which typically include temperature cycling environments.

For the reasons explained above, it would be desirable to provide a material for a multi-layer substrate that has a TEC that closely matches, or that can be easily tailored to match, that of the intended support core or base member to which the multi-layer substrate is to be joined or otherwise installed.

In addition, it would also be desirable to provide a material for a multi-layer substrate that is sufficiently densified at relatively low sintering temperatures, e.g., around 900° C., and that can be suitably provided with, and co-fired with, a relatively low melting point, low resistance metal, such as Ag, Cu and such alloys, especially for LTCC-type applications. Most ceramic and glass materials, however, require significant heat-treatment at temperatures exceeding 900° C. in order to achieve sufficient densification and the desired electrical characteristics. When higher processing temperatures are involved, however, metals having a higher melting point need to be used. High melting point metals, however, have inferior electrical conductivity compared to Ag, Au, and Cu, for example. Thus, it would be more desirable to use a material for the multi-layer substrate that also facilitates the use of such low melting point metals, particularly in co-firing situations.

Most ceramic and glass materials that have a suitable TEC do not also have a suitably low dielectric constant (K) and low loss tangent (or high Q factor), which makes these ceramic materials less desirable for high frequency electronic applications. On the other hand, most ceramic and glass materials having a suitably low dielectric constant and high Q factor do not have a suitable TEC, and in particular, the TEC cannot be tailored to match that of the structure to which the multi-layer substrate is to be bonded.

It would also be desirable, therefore, to provide a multi-layer substrate material that, in addition to having an easily tailorable TEC, also has desirable electrical properties, such as a low dielectric constant (K) and a high Q factor, that is, 1/loss tangent, especially for electronic applications that involve high frequencies (i.e., up to 60 GHz).

SUMMARY OF THE INVENTION

It is an object of the present invention to provide a glass-ceramic that is suitable for use as a multi-layer substrate in high frequency electronic packaging applications such as low temperature co-fired ceramic (LTCC) applications, co-fired ceramic on metal applications (i.e., a metal-ceramic substrate with wiring and attached active and passive circuit elements) and thin-film metallized glass-ceramic packages bonded to assemblies or substrates made of ceramic or metal, for example. It is also an object of the present invention to provide an electronic packaging assembly including such glass-ceramics. Additionally, it is an object of the present invention to provide a glass-ceramic material that is suitable for stand-alone substrate applications, such as a substrate with thin-film wiring, for use in high frequency electronic applications.

The glass-ceramic material according to the present invention has a thermal expansion coefficient that closely matches, or can be easily tailored to match, that of the desired support core or base material to which the multi-layer ceramic substrate is to be joined, is sufficiently densified when sintered at a relatively low temperature of about 900° C., has a low dielectric constant of 4–7.5, preferably less than 7, and also has a very low loss tangent (i.e., a high Q factor of greater than 400, more preferably, greater than 500, and even more preferably, greater than 550).

According to one embodiment of the present invention, a glass-ceramic is provided having a thermal expansion coefficient in a range of 4–8.5 ppm/° C., a dielectric constant in a range of 5–7 and a Quality factor Q of at least 400.

The glass-ceramic of the present invention consists essentially of $SiO_2$ in a range of 40–55 wt %, $Al_2O_3$ in a range of 7–22 wt % and MgO in a range of 6 to less than 26 wt %. $SiO_2$, $Al_2O_3$, and MgO constitute the core composition. In addition to the core composition, the glass-ceramic of the present invention also includes at least one of BaO in an amount up to 35 wt %, SrO in an amount up to 37 wt % and ZnO in an amount up to 17 wt %. It is also preferred that the glass-ceramic further includes at least one of $B_2O_3$ in an amount up to 10 wt %, $P_2O_5$ in an amount up to 4 wt %, and up to 10 wt % $GeO_2$.

Preferably, the core composition of the glass-ceramic of the present invention contains 40.5–50.5 wt % $SiO_2$, 11.5–16.5 wt % $Al_2O_3$, and up to 16 wt % MgO. In this preferred composition, in addition to the core composition, the glass-ceramic also includes at least one of BaO in an amount up to 25 wt %, SrO in an amount up to 30 wt % and ZnO in an amount up to 16 wt %.

When the glass-ceramic composition primarily includes BaO in addition to the core composition, the glass-ceramic has a BaO—$Al_2O_3$-$2SiO_2$ main crystal phase. When the glass-ceramic primarily includes SrO in addition to the core composition, the glass-ceramic has a SrO—$Al_2O_3$-$2SiO_2$ main crystal phase. When the glass-ceramic primarily includes ZnO in addition to the core composition, the glass-ceramic can include a zinc aluminosilicate phase, such as $2ZnO$-$2Al_2O_3$-$5SiO_2$ and/or a zinc aluminate (gahnite) main crystal phase, with little to no cordierite. In the context of the present invention, the phrase "main crystal phase" refers to a crystal phase that is present in an amount that is greater than any other phase. Minor phases are crystal phases that are present in a lesser amount, which is typically less than about 25%. The presence of such main and minor crystal phases is determined by XRD analysis.

The glass-ceramic according to the present invention can also include BaO and SrO in addition to the core composition. In this case, it is preferred that the glass-ceramic includes BaO in a range of 0.5–34 wt % and SrO in a range of 0.5–36 wt %, and more preferably, BaO in a range of 2–20 wt % and SrO in a range of 5–20 wt %. The main crystal phase of the glass-ceramic according to this aspect of the present invention is BaO—$Al_2O_3$-$2SiO_2$ or SrO—$Al_2O_3$-$2SiO_2$, or a mixture of these crystal phases depending upon the relative amounts of BaO and SrO in the formulation.

The glass-ceramic according to the present invention can also include BaO and ZnO in addition to the core composition. In this case, it is preferred that the glass-ceramic includes BaO in a range of 0.5–34 wt % and ZnO in a range of 0.5–16 wt %, and more preferably, BaO in a range of 2–20 wt % and ZnO in a range of 2–12 wt %. The main crystal phase of the glass-ceramic according to this aspect of the present invention is typically BaO—$Al_2O_3$-$2SiO_2$, and may also include a relatively large amount of zinc aluminate or zinc aluminosilicate.

The glass-ceramic according to the present invention can also include ZnO and SrO in addition to the core composition. In this case, it s preferred that the glass-ceramic includes ZnO in a range of 0.5 to 16 wt % and SrO in a range of 0.5–36 wt %, and more preferably, ZnO in a range of 1–13 wt % and SrO in a range of 5–15 wt %. The main crystal phase of the glass-ceramic according to this aspect of the present invention is typically $SrO$—$Al_2O_3$-$2SiO_2$, and may also include a relatively large amount of zinc aluminate or zinc aluminosilicate.

The glass-ceramic according to the present invention can also include an amount of BaO, SrO and ZnO in addition to the core composition. In this case, it is preferred that BaO is present in a range of 0.5–34 wt %, SrO is present in a range of 0.5–36 wt % and ZnO is present in a range of 0.5–16 wt %. It is more preferable that BaO is present in a range of 5–15 wt %, SrO is present in a range of 5–15 wt % and ZnO is present in a range of 1–10 wt %.

When the glass-ceramic of the present invention is provided in a powder or particulate form, the glass-ceramic can be easily processed. That is, the glass-ceramic according to the present invention can be easily processed into green multi-layer laminates by mixing the glass-ceramic powders with casting additives and tape casting the slurry into a green tape that can be made into a plurality of individual green sheets that are stacked (layered), laminated and heat-treated at a low temperature to remove organics and the like to form a green multi-layer structure.

The glass-ceramic according to the present invention can readily be used in a wide variety of high frequency electronic applications at frequencies up to about 60 gigahertz by virtue of the low dielectric constant and high Q factors. Since the glass-ceramic according to the present invention can be thermally processed and compositionally adjusted to have a wide TEC range while maintaining the desirable high frequency electrical characteristics of low dielectric constant (K) and high Q, it can be used in connection with a wide variety of members made from a variety of materials having a very high, or a very low, TEC in both co-firing and non-co-firing applications.

Examples of such members include sintered ceramic members made of AlN or $Al_2O_3$, and metal cores or metal supports made of KOVAR® or Cu/Mo/Cu, for use in heat sink applications, for example. The glass-ceramic according to the present invention can also be bonded with active components, such as integrated circuits, and silicon substrates and gallium arsenide members. In addition, the high TEC characteristics of the glass-ceramic according to one embodiment of the present invention (that can be obtained by compositional adjustment and heat treatment described in more detail below) enables this glass-ceramic to bond well with materials such as FR4 and other similar circuit board materials, or metals like Al or Cu, which have a high TEC of 16–22 ppm/° C.

Further, the glass-ceramic according to the present invention is also compatible with a variety of thin-film metals, including, but not limited to, Au, Ag, Al, Ni, Pt, Cu, Pd, Fe, Ti, Cr, and various alloys thereof, and thin-film processing techniques, such as sputtering and CVD, as well as thick-film processing (e.g., paste printing) and other "personalization" processes. Personalizing the green sheets prior to lamination can involve, for example, forming vias and filling the vias with suitable via pastes, and forming other structural features to define cavities and the like in the final, laminated glass-ceramic substrate. Thick-film processing typically involves printing signal lines, ground planes and the like using conductive inks or pastes, for example.

According to another embodiment of the present invention, an electronic package is provided, including a metal base and a glass-ceramic substrate bonded to the metal base. The glass-ceramic substrate has a thermal expansion coefficient in a range of 4–8.5 ppm/° C., a dielectric constant in a range of 5–7 and a Quality factor (1/loss tangent) Q of at least 400. Preferably, the electronic package according to the present invention further comprises a bonding layer interposed between the metal base and the glass-ceramic substrate.

According to one aspect of the present invention, the bonding layer comprises a low melting point glass contacting at least the metal base. According to another aspect of the present invention, the bonding layer comprises a solder.

When the glass-ceramic substrate is first metallized and sintered before being bonded with the core, the bonding layer preferably includes a solder. When the glass-ceramic substrate is green, that is, not sintered, before being bonded with the core, the bonding layer is preferably includes a low melting point glass.

The glass-ceramic can also include a conductive pattern formed in communication with at least one surface thereof that is co-fired with the glass-ceramic substrate. Since the glass-ceramic according to the present invention achieves sufficient densification at low firing temperatures, conductive patterns and/or metallized regions can be formed on the green laminated body using a relatively low melting point metal, such as Ag. That is, since the glass-ceramic substrate becomes densified to greater than 96% at sintering temperatures below about 925° C., Ag conductive patterns or metallized portions formed thereon will not be deteriorated during sintering. It should be noted, however, that conductive patterns can also be provided after the glass-ceramic is sintered, as well.

The TEC of the glass-ceramic according to the above embodiment of the present invention is easily adjusted to achieve a close TEC match with that of the support material (e.g., metal or sintered ceramic core) to which the glass-ceramic substrate is bonded in high frequency electronic applications. For example, since the $\alpha_{RT\text{-}300}$ of a non Ni-plated, laminated Cu/Mo/Cu metal core is about 5.3 ppm/° C., and the $\alpha_{RT\text{-}300}$ of the glass-ceramic material according to one embodiment of the present invention is 5.4 ppm/° C., the close match ensures good bonding (e.g., via a solder when the glass-ceramic material is metallized) without thermal mismatch defects such as cracking or bowing at low temperatures. When the TEC of the glass-ceramic material according to the present invention is significantly higher or lower than that of the material to which it is bonded, such as a Ni-plated, laminated or powder metallurgy Cu/Mo/Cu cores, the TEC of the glass-ceramic can be easily adjusted by adding a TEC adjusting additive, such as cordierite, fused silica, cristobalite, trydimite or quartz, to the glass-ceramic powder at the tape slurry preparation stage before forming the tapes that are laminated together to form the glass-ceramic substrate. Other TEC modifying agents can also be added as particulates at the tape slurry preparation stage so long as the added material has a crystal phase that has a desirably higher or lower TEC compared to the glass-ceramic, a low K and a high Q, in order to retain these preferred characteristics in the mixture.

According to another embodiment of the present invention, a glass-ceramic is provided having a thermal expansion coefficient in a range of 5–22 ppm/° C., a dielectric constant (K) in a range of 4–7 and a Quality factor Q of at least 400. Preferably, the glass-ceramic material consists essentially of SiO$_2$ in a range of 47–54 wt %, Al$_2$O$_3$ in a range of 12–18 wt %, MgO in a range of 12–20 wt %, and ZnO in a range of 5–20 wt %.

According to one aspect of the present invention, the glass-ceramic has a main crystal phase comprising at least one of cristobalite, trydimite and quartz.

The TEC of the glass-ceramic according to the above embodiment of the present invention is easily adjusted to achieve a close match with that of the support material on which is bonded in electronic applications. For example, according to one aspect of the present invention, the glass-ceramic further includes 0.1–20 wt % of a crystalline silica material such as quartz, cristobalite or trydimite or, alternatively, another material that crystallizes to produce these phases, that is added as a particulate to the glass-ceramic material during the tape slurry preparation stage. More preferably, 2–12 wt % of one of these is included. This is preferred when the TEC of the base material to which the glass-ceramic is to be bonded is higher than that of the glass-ceramic.

According to other embodiments of the present invention, an electronic package is provided, including one of a metal base member and a sintered ceramic base member, and a glass-ceramic substrate comprising the glass-ceramic according to the previous embodiment bonded to the base member. The electronic package further comprises a bonding layer interposed between the metal base and the glass-ceramic substrate. The bonding layer can be solder or a bond glass. Preferably, the sintered ceramic base member comprises AlN or Al$_2$O$_3$.

It should also be noted that the glass-ceramic according to the present invention is a true glass-ceramic material having a crystalline phase dispersed within a glassy-phase matrix, not merely a ceramic-and-glass composite material made from a mixture of ceramics and glasses, as is the case with many prior art LTCC compositions.

BRIEF DESCRIPTION OF THE DRAWINGS

For a better understanding of the nature and objects of the present invention, reference should be made to the following detailed description of a preferred mode of practicing the invention, read in connection with the accompanying drawings and Examples, in which:

FIG. 2b is a cross-sectional view of the final ceramic packaging assembly of FIG. 2a;

FIG. 4b is a cross-sectional view of the final ceramic packaging assembly of FIG. 4a.

DETAILED DESCRIPTION OF THE INVENTION

Figure 1:
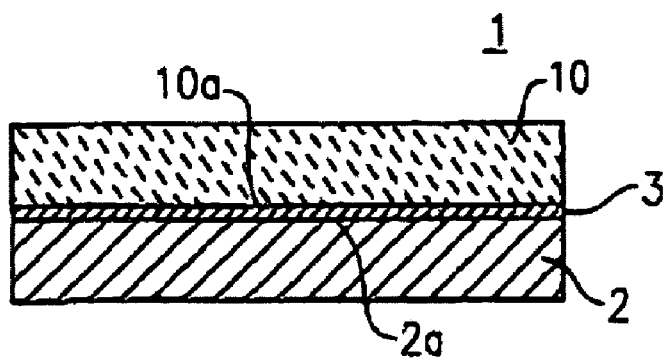
FIG. 1 is a cross-sectional view of a ceramic packaging assembly according to one embodiment of the present invention.

The glass-ceramic according to one embodiment of the present invention consists essentially of SiO$_2$ in a range of 40–55 wt %, Al$_2$O$_3$ in a range of 7–22 wt % and MgO in a range of 6 to less than 26 wt %. SiO$_2$, Al$_2$O$_3$, and MgO to constitute the core composition. In addition to the core composition, the glass-ceramic material of the present invention also includes at least one of BaO in an amount up to 35 wt %, SrO in an amount up to 37 wt % and ZnO in an amount up to 17 wt %. The glass-ceramic has a TEC in a range of 4.0–8.5 ppm/° C., a K in a range of 5–7, and a Q of at least 400.

When more than 55 wt % SiO$_2$ is added, the higher silica concentration makes the glass-ceramic difficult to melt, densify, and crystallize at relatively low temperatures below about 950° C. When less than 40 wt % SiO$_2$ is added, the lower silica concentration tends to promote excessively rapid crystallization and lower temperature crystallization, reduces the tendency for stable glass-ceramic formation and tends to promote a higher TEC, a higher K and a lower Q, which are undesirable.

When more than 22 wt % Al$_2$O$_3$ is added, the higher alumina concentration tends to result in more rapid crystallization, a higher cordierite level and lower expansions, or a higher Sr/Ba-aluminosilicate level and higher TEC's and K's (depending upon the type and amount of alkaline earth oxide present). When less than 7 wt % Al$_2$O$_3$ is added, the lower alumina concentration levels result in a tendency for lower glass-ceramic formation, lower stability, a higher K, a higher TEC and a lower Q.

When more than nearly 26 wt % MgO is added, the higher magnesia concentration decreases the stability of glass-ceramic formation and can undesirably increase the crystallization rate, and increase K and the TEC. When less than 6 wt % MgO is added, the lower magnesia concentration can lead to excessively refractory materials with high densification and crystallization temperatures or an excessively high K and Q.

Higher BaO concentrations (i.e., exceeding 35 wt %) tend to produce a higher TEC and K. Similarly, higher SrO concentrations (i.e., exceeding 37 wt %) also tend to produce a higher TEC and K. Higher ZnO levels (i.e., exceeding 17 wt %) can undesirably decrease Q and lower glass-ceramic stability. The lower limit of ZnO is not critical.

As explained in more detail below in connection with the Examples, the glass-ceramic composition according to one aspect of the present invention includes SrO, but does not include BaO or ZnO. The glass-ceramic composition according to another aspect of the present invention includes BaO, but does not include SrO or ZnO. The glass-ceramic composition according to yet another aspect of the present invention includes ZnO, but does not include SrO or BaO, and the glass-ceramic composition according to another aspect of the present invention includes SrO and BaO, but does not include ZnO. Although it is not illustrated herein by way of example, the glass-ceramic material according to another aspect of the present invention can also include SrO, BaO and ZnO in addition to the core composition.

As shown in Table I, in the compositions of Examples 1–3, oxides of boron (i.e., B$_2$O$_3$) and phosphorus (i.e., P$_2$O$_5$) can also be provided as fluxing materials to assist in controlling the melting behavior and reducing the crystal growth rate for the glass-ceramic compositions according to the present invention. This provides a beneficial increase in the processing range (time-temperature-heating rate) and overall manufacturability of the glass-ceramic according to the present invention. If included, B$_2$O$_3$ is preferably provided in an amount of up to 10 wt %, and more preferably 0.5–4 wt %, and P$_2$O$_5$ is provided in an amount of up to 10 wt %, preferably less than 4 wt %, and more preferably 0.5–3 wt %. Although it is not shown in the Examples, germanium oxide (GeO$_2$), in an amount of up to 10 wt %, can also be added to achieve similar results, though $GeO_2$ tends to be a more expensive component, and is thus lessdesirable from an economic standpoint.

When provided in an amount up to 10 wt %, $B_2O_3$ desirably improves glass-ceramic formation, the tendency for successful glass melting, and the promotion of controllable crystallization rates and workable materials, as well as expands the compositional range for suitable/workable materials. $B_2O_3$ concentrations exceeding 10 wt %, however, can result in a higher K, lower Q and higher TEC, generally interfere with the development of the preferred crystalline phases, and can also prevent the use of butvar as a tape binder, producing an undesirable gelling reaction.

Low levels of phosphorous pentoxide, i.e., up to 10 wt %, function in a manner similar to the boron oxide in assisting in glass melting and providing a relatively stable glass-ceramic formation. At concentration levels higher than 10 wt %, however, $P_2O_5$ tends to enhance the crystallization tendency and rates and can thus lead to poor control over devitrification.

Germanium oxide additions are functionally analogous to boron oxide. Combinations of boron and germanium oxides or boron, phosphorus and germanium oxides can also be very useful in controlling crystallization kinetics.

As explained in more detail below, TEC modifying agents such as cordierite, fused silica and crystalline silica, such as quartz, can also be added to the glass ceramic powders of the present invention at the tape slurry preparation stage to decrease or increase the TEC of the glass-ceramic and produce a glass-ceramic substrate that has a TEC that more closely matches the TEC of the core or support member to which it is to be bonded. The glass-ceramic substrates of Examples 7-1 to 9 include quartz and/or cordierite that are added as a particulate at the tape slurry preparation stage.

Materials other than cordierite and quartz can also be used as TEC modifying agents to tailor the TEC of the glass-ceramic according to the present invention to more closely match that of the base material to which the glass-ceramic is to be bonded. For example, as mentioned above, fused silica, having a very low TEC of 0.5 ppm/° C., a low dielectric constant of 3.8 and a high Q exceeding 500, can be favorably used to lower the TEC of the glass-ceramic instead of cordierite. Additionally, while quartz offers a very high TEC of 18 ppm/° C., a low dielectric constant of 4.2 and a high Q, other materials can also be used to increase the TEC of the glass-ceramic, such as cristobalite, tridymite and the glass-ceramics of Examples 10-1 to 10-7, which, when processed at high temperatures, have a high TEC, low dielectric constant and very high Q, as shown in Table II and explained in more detail below in connection with Examples 10-1 to 10-6.

It should also be noted that adding cordierite can also favorably decrease the dielectric constant without significantly affecting the Q of the glass-ceramics of Examples 7-1 to 7-4, which is desirable for high frequency electronic package applications.

The glass ceramics according to the present invention can be formed in the following manner. Raw materials, including oxides, hydroxides, peroxides and carbonates of the compositional components of the desired glass-ceramic composition are mixed (homogenized) and the mixture is placed in a Pt crucible, for example, which is then heated to a temperature of about 1400–1600° C. The molten glass-ceramic is rapidly cooled or quenched and pulverized into a glass-ceramic powder having an average particle size on the order of 1–15 µm. This glass-ceramic powder is suitable for processing green structures, e.g., multi-layer green sheet structures, which can be personalized, laminated, sintered, metallized and bonded to a support member or core at low temperatures via solder, for example, in non-co-firing applications. The laminated green sheet structures can also be personalized, laminated and simultaneously sintered with a core material at higher temperatures (i.e., a co-firing situation).

A green multi-layer laminated structure can be formed in the following manner. Glass-ceramic powder that is obtained as described above is combined with suitable processing additives, such as binders, solvents, plasticizers, dispersants and viscosity adjusters to produce a tape slurry. Examples of suitable processing additives include, but are not limited to, methyl and ethyl alcohol, toluene, MIBK, MEK (or water), BUTVAR® (polyvinyl butyral), acrylic binders, di-butyl phathalate and fish oil.

When the glass-ceramic includes SrO or BaO in addition to the core composition, a TEC reducing additive, for example, an additive consisting of 0.1–20 wt % cordierite or fused silica, preferably 1–15 wt % cordierite, can also be added, if needed, as a particulate during the tape slurry preparation stage after the glass-ceramic is formed and pulverized into a powder but before green tapes are formed. This is preferred when the TEC of the base material to which the glass-ceramic is to be joined is lower than that of the glass-ceramic. In this case, it is preferred that the TEC reducing additive has an average particle size of 0.1–20 µm, and in particular, that the added cordierite has an average particle size of 1 µm.

Additionally, when the glass-ceramic compositions includes SrO or BaO in addition to the core composition, TEC increasing additives, for example, additives consisting of crystalline silica or a mixture of, for example, 0.1–8 wt % cordierite and 0.1–15 wt % quartz, can be added, if needed, as particulates during the tape slurry preparation stage. More preferably, cordierite is added in a range of 0.1–4 wt % and quartz is added in a range of 1–12 wt %. This is preferred when the TEC of the base material to which the glass-ceramic is to be joined is higher than that of the glass-ceramic. It should be noted that the particle size and amount of quartz and cordierite added are important when these additives are used as nucleating agents. In this case, it is preferred that the TEC increasing additive has an average particle size of 0.1–20 µm and in particular, that the added cordierite has an average particle size of 1 µm, and that the added quartz has an average particle size of 3 µm.

When the glass-ceramic includes BaO and SrO in addition to the core composition, a TEC reducing additive, for example, an additive consisting of 0.1–20 wt % cordierite or fused silica, can be added, if needed, as a particulate during the tape slurry preparation stage. More preferably, cordierite is added in a range of 2–12 wt %. This is preferred when the TEC of the base material to which the glass-ceramic is to be joined is lower than that of the glass-ceramic. In this case, it is preferred that the TEC reducing additive has an average particle size of 0.1–20 µm, and in particular, that the added cordierite has an average particle size of 1 µm.

When the glass-ceramic includes BaO and SrO in addition to the core composition, a TEC increasing additive, such as crystalline silica, for example, quartz, can be added, if needed, in an amount of 0.1–20 wt % as a particulate during the tape slurry preparation stage. This is preferred when the TEC of the base material is higher than that of the glass-ceramic. The TEC increasing additive preferably has a particle size of 0.1–20 µm, and in particular, it is preferred that quartz having a particle size of 3 µm is added.

When the glass-ceramic includes ZnO in addition to the core composition, a TEC increasing additive, for example, an additive consisting of 0.1–20 wt % crystalline silica, such as quartz, can be added, if needed, as a particulate during the tape slurry preparation stage. More preferably, quartz is added in a range of 2–12 wt %. This is preferred when the TEC of the base material to which the glass-ceramic is to be joined is higher than that of the glass-ceramic. In this case, it is preferred that the TEC increasing additive has an average particle size of 0.1–20 μm, and in particular, that the added quartz has an average particle size of 3 μm.

When the glass-ceramic includes ZnO in addition to the core composition, a TEC reducing additive, for example, an additive consisting of 0.1–20 wt % cordierite or fused silica, can be added, if needed, as a particulate during the tape slurry preparation stage. More preferably, cordierite is added in a range of 2–12 wt %. This is preferred when the TEC of the base material to which the glass-ceramic is to be joined is lower than that of the glass-ceramic. In this case, it is preferred that the TEC reducing additive has an average particle size of 0.1–20 μm, and in particular, that the added cordierite has an average particle size of 1 μm.

The tape slurry is tape cast using a doctor blade, for example, to form green tapes having a thickness of about 8–12 mm. The green tapes are cut into individual green sheets about 75 mm long and 75 mm wide, and a number of these green sheets, for example, 6, are stacked together to form a multi-layer green sheet structure. The multi-layer green sheet structure is then laminated under heat and pressure conditions. For example, the multi-layer green sheet structure is laminated at a temperature of 50–75° C. and a pressure of 100–500 psi, to form a green multi-layer laminated structure.

It should be noted that, prior to lamination, the individual green sheets can also be "personalized," or provided with a plurality of vias or other structural features such as cavities, in any conventional manner, such as by punching. Additionally, conductive patterns can also be provided on the individual green sheets prior to stacking and laminating the multi-layer green sheet structure by printing or any other suitable method. Since the glass-ceramics of the present invention obtain a high density, even when fired at a relatively low firing temperatures of about 900° C., low melting point metals such as Ag paste, for example, which has a relatively low melting point of 962° C., can be used to metallized the substrate, or to form printed circuits on the individual sheets prior to lamination.

A glass-ceramic substrate that is metallized for solder-bonded packaging applications with a metal or sintered ceramic core member in a non-co-firing situation can be formed as follows. The green multi-layer laminated structure is heated to a temperature of less than 500° C. to remove binders and organics in the like at a slow ramp rate of 2–3° C./min for approximately 10–60 minutes. The green multi-layer laminated structure is then fired at a faster ramp rate of 5–10° C./min to a temperature of about 900° C. and held for 10–15 minutes to densify and sinter the green multi-layer laminated structure to form a glass-ceramic substrate and to allow the crystalline phases to develop in the glass-ceramic substrate.

After the glass-ceramic substrate has cooled, the surfaces may be ground, if needed, to achieve a desired substrate thickness, preferably 0.15–1 mm for electronic package applications, for example, and 0.15–4 mm for stand-alone substrate applications, and also to flatten out the substrate surfaces. After the glass-ceramic substrate is ground to the desired thickness and flattened, the glass-ceramic substrate is metallized in preparation for soldering. That is, a thin film metal, for example such as Au or a sandwich of Ti—Ni—Au or alloys thereof, is applied to the surfaces of the glass-ceramic substrate by sputtering, for example.

It should be noted that other glass-ceramic substrate preparation options include providing a metallization pattern before sintering the green multi-layer substrate and omitting the grinding and post-sintering metallization step. Further, a green multi-layer laminated structure can be provided with a thick-film metal, sintered and then ground, if necessary, to achieve the desired flatness. If the grinding step is necessary, a thin film metal can thereafter be applied to the sintered glass-ceramic substrate. If the grinding step is not necessary, the thin film metal can be applied after the sintering step.

The glass-ceramic substrate is then subjected, for example, to an etching process, such as photolithography or chemical etching, to form a pattern of solder bands. Solder bands can also be formed using a post-sintering thick film metallization technique, such as printing, for example. It should be noted that the positions of the solder bands preferably correspond to the outline of the perimeter of rectangular holes that are provided in metal cores to which glass-ceramic substrate is bonded. A solder material, such as an Au/Sn solder, is applied to the solder bands, and the metallized glass-ceramic substrate is positioned over a core member, such as a non-Ni-plated, laminated Cu/Mo/Cu metal core or a metallized, sintered AlN core, for example, to form an assembly.

The assembly is heated to a temperature of about 280° C. to reflow the solder and to form a bond between the glass-ceramic substrate and the metal core. Since the bonding temperature of the assembly is relatively low, that is, less than 300° C., it is important that the $\alpha_{RT\text{-}300}$ values for the glass-ceramic substrate and the metal core are closely matched in this temperature range.

On the other hand, in co-fired ceramic packaging applications, the green multi-layer laminated structure is not sintered prior to being joined with the support core, and is not metallized to facilitate solder-bonding. A suitable support member, such as a laminated Cu/Mo/Cu core, is provided, wherein the surfaces of the Cu/Mo/Cu core are coated with Ni, for example, by plating. It should be noted, however, that the method for applying the Ni layer to the laminated Cu/Mo/Cu metal core is not limited to plating, and can also be formed by thin-film techniques, for example. The Ni-coated Cu/Mo/Cu core is heat-treated to a temperature of about 650–850° C. for 2–20 minutes to oxidize the Ni, which aids the bonding with the glass-ceramic substrate during sintering.

In situations where the green multi-layer laminated structure is co-fired with a sintered AlN or $Al_2O_3$ ceramic base member, for example, it may not be necessary to plate the ceramic base member with Ni or another metal to aid bonding, as described above with respect to the metal base. If Ni plating, or other metal plating, is used, then a procedure that is analogous to that described above with respect to the metal core will produce an analogous structure.

A bond glass paste is provided by screen printing, for example, onto the joining surface of the oxidized, Ni-plated Cu/Mo/Cu or sintered ceramic core. The core member is then heat-treated at a temperature of about 550–800° C. for 5–30 minutes, for example, to burn out the paste binders and organics and to flow the bond glass particles into a smooth, adherent film. It should be noted that the bond glass is selected based on its softening-point and TEC, depending upon the composition of the glass-ceramic, the properties of the core member, and the ultimate sintering temperature to be used. Accordingly, different bond glass compositions will require different heat-treating conditions than those described above and those described in connection with the specific Examples illustrated herein. One of ordinary skill in the art should be able to select an appropriate bond glass and perform appropriate heat-treating steps in view of the properties of the selected bond glass and packaging assembly components.

A binder, preferably the same binder that was used to form the green tapes (described above), is combined with an organic adhesive, such as MIBK or MEK with alcohol to form an organic adhesive, which is applied to the surface of the bond glass film on the joining surface of the Ni-coated Cu/Mo/Cu or sintered ceramic core. The green multi-layer laminated structure is positioned on the organic adhesive/glass film-coated surface of the Cu/Mo/Cu or sintered ceramic core to form an assembly. The assembly is then fired together to a temperature of about 900° C. for 10–15 minutes and then cooled. It should also be noted, however, that for some embodiments of the present invention, the desired K, Q and TEC values are obtained when the glass-ceramic is sintered at higher temperatures exceeding 1000° C., more preferably, at sintering temperatures of about 1100° C. Specific examples are described in more detail below in connection with Examples 10-1 to 10-7.

In the Examples detailed below, the thermal and electrical properties of the glass-ceramic according to the present invention are shown with respect to the different thermal cycles to which they were subjected when the green multi-layer laminated structures (formed from glass-ceramic powder as described above) were sintered.

The thermal cycles are reported in terms of maximum times and temperatures. Dielectric constant (K) measurements were made using a Kent resonant fixture at a frequency of 10–15 gigahertz. Thermal expansion coefficients (TEC or $\alpha$) were measured using a commercial push-rod dilatometer (Theta, Inc.) and, unless otherwise noted, represent the average thermal expansion coefficient from room temperature to 300° C. X-Ray Diffraction (XRD) analysis was performed on the samples using a commercial unit manufactured by Philips and the data was obtained using MDI Datascan software with Phase ID analysis using MDI Jade 6.0 software.

It should be understood by those skilled in the art that the present invention is in no way limited to the examples described herein, and that variations and substitutions can be made without departing from the scope and spirit of the present invention.

EXAMPLE 1

A glass-ceramic having the composition shown in Table I was formed by batching and combining various oxides and carbonates (i.e., raw material forms) of each of the constituent components in the amounts shown. In Example 1, SrO was included in addition to the core composition. The raw material components were mixed (homogenized) and the mixture was placed in a Pt crucible, which was heated to a temperature of about 1500° C. for about 3 hours. The glass-ceramic was cooled and pulverized into a powder having an average particle size on the order of 8 μm.

EXAMPLE 2

A glass-ceramic powder having the composition shown in Table I was produced in the same manner as described above in connection with Example 1. In Example 2, BaO, instead of SrO, was included in addition to the core composition.

EXAMPLE 3

A glass-ceramic power having the composition shown in Table I was produced in the same manner described above in connection with Examples 1 and 2. In Example 3, ZnO, instead of BaO or SrO, was included in addition to the core composition.

EXAMPLE 4-1

A glass-ceramic substrate was formed using the glass-ceramic powder from Example 1 in the following manner. The glass-ceramic powder of Example 1 was combined with an organic binder system including a BUTVAR®-based binder, fish oil, and methylethyl ketone (MEK), for example, to form a tape slurry. The tape slurry was tape cast using a doctor blade to form green tapes having a thickness of about 10 mils (0.254 mm). The green tapes were cut into individual green sheets about 75 mm long and 75 mm wide, and six of these green sheets were stacked together to form a multi-layer green sheet structure. The multi-layer green sheet structure was laminated at a temperature of 85° C. and a pressure of 300 psi, to form a green multi-layer laminated structure.

The green multi-layer laminated structure was slowly heated in a belt furnace at a ramp rate of about 2–3° C./min through a temperature range of about 100–400° C. to remove the binder(s), residual solvents and other organics. The ramp rate was then increased to 5–10° C./min to a temperature of about 900° C., which was held for 10–15 minutes to densify and sinter the green multi-layer laminated structure into a glass-ceramic substrate and to allow the crystalline phases to develop in the glass-ceramic substrate.

The characteristics of the glass-ceramic substrate of Example 4-1 are shown in Table I. In addition, the glass-ceramic of Example 4-1 had a main crystal phase of SrO—$Al_2O_3$-$2SiO_2$ and included minor phases of enstatite (MgO—$SiO_2$) and forsterite (2MgO—$SiO_2$). No cordierite phase was detected.

EXAMPLE 4-2

A glass-ceramic substrate was formed using the glass-ceramic powder from Example 2 in the same manner described above in connection with Example 4-1. In addition to the characteristics of the glass-ceramic substrate of Example 4-2 that are shown in Table I, the glass-ceramic of Example 4-2 had a Celsian main crystal phase (BaO—$Al_2O_3$-$2SiO_2$) and another Barium aluminosilicate primary crystal phase, as well.

EXAMPLE 4-3

A glass-ceramic substrate was formed using the glass-ceramic powder from Example 3 in the same manner described above in connection with Example 4-1. The characteristics of the glass-ceramic substrate produced according to Example 4-3 are shown in Table I.

When sintered to a temperature of 900° C. for ten minutes, the glass-ceramic of Example 3 had a zinc aluminosilicate main crystal phase ($2ZnO$-$2Al_2O_3$-$5SiO_2$) and also included phases of gahnite (ZnO—$Al_2O_3$) and enstatite. Small amounts of cordierite and spinel were also detected.

When processed at higher temperatures however, as shown and described in more detail below in connection with Example 10-1 to 10-4, the glass-ceramic of Example 3 (which is the same composition as that of Example 10-1) had a high crystalline silica concentration, (e.g., cristobalite and quartz concentration) as a main crystal phase and included a minor amount of gahnite, while other phases were notably diminished.

EXAMPLE 5

A non-co-fired ceramic packaging assembly was formed in the following manner. The glass-ceramic substrate of Example 4-1 was prepared as described above. After the glass-ceramic substrate was ground to the desired thickness and flattened, a thin film metal of Ti—Ni—Au was applied to the surfaces of the sintered glass-ceramic substrate by sputtering.

A dry photoresist was laminated to the metallized substrate, exposed and developed under standard processing procedures to provide a protective mask over the metal. The exposed portions of the metal were removed using commercial etchants and procedures, and the photoresist was etched away to form a pattern of discrete solder bands on the substrate. A solder material comprising an 80/20 Au/Sn eutectic mixture was applied to the solder bands as a screened paste, and the metallized glass-ceramic substrate was positioned over a laminated Cu/Mo/Cu metal core that was plated with a thin layer of Ni and Au to prevent Cu oxidation and to provide a clean surface for the solder band.

It should be noted that, in this case, the metal core was provided with a very thin layer of Ni, having a thickness on the order of 1.3 μm, and then a very thin layer of Au, having a thickness on the order of 0.13 μm, was applied by immersion on both sides. Since the Ni and Au layers are very thin, these layers have little to no impact on the TEC of the metal core. In the case where a bond glass is used to bond the glass-ceramic substrate and a metal core, however, the metal core is plated with a thicker layer of Ni and oxidized, which does affect the TEC of the core.

In this Example, the laminated Cu/Mo/Cu core had a 13/74/13 composition and an $\alpha_{RT-300}$ of about 5.3 ppm/° C. The assembly was heated to a temperature of 280° C. to reflow the solder and to form a bond between the glass-ceramic substrate and the metal core.

The characteristics and evaluations of the ceramic packaging assembly formed in Example 5 are shown in Table I. The assembly showed good bonding between the metallized glass-ceramic substrate and the Cu/Mo/Cu, and no defects were observed.

EXAMPLE 6

A co-fired ceramic packaging assembly was produced in the following manner. A glass-ceramic powder having the composition of Example 1 was used to produce a green multi-layer laminated structure as described in Example 4-1. Unlike the metallized glass-ceramic substrate of Example 5, however, the green multi-layer laminated structure of Example 6 was not sintered or metallized in preparation for soldering prior to being joined with the metal core.

A laminated Cu/Mo/Cu core as in Example 5 was provided as the metal core member. In Example 6, however, the surfaces of the Cu/Mo/Cu core were coated with Ni by plating. The Ni-coated Cu/Mo/Cu core was heat-treated to a temperature of 800° C. for 30 minutes to oxidize the Ni. A bond glass paste having a green thickness of about 0.5–2 mils was screen printed onto the joining surface of the oxidized, Ni-plated Cu/Mo/Cu core, and then heat-treated at a temperature of about 800° C. for 30 minutes to burn out the paste binders and organics and to flow the bond glass particles into a smooth, adherent film about 0.2–1.5 mils thick.

The same binder that was used to form the green tapes (described above in connection with Example 4-1) i.e., polyvinyl butyral, was combined with a methanol/MEK solvent, and the resultant organic adhesive was applied to the surface of the bond glass layer to form a film less than 1 mil thick on the joining surface of the Ni-coated Cu/Mo/Cu core. The thickness of the organic adhesive film is not critical so long as it is sufficient to compensate for differences in the surface structures of the multi-layer laminated structure and the bond glass-coated core.

The green multi-layer laminated structure was positioned on the organic adhesive/glass film-coated surface of the core, and adhered to the core to form an assembly. The assembly was then simultaneously fired to a temperature of about 900° C. for 10–15 minutes and cooled. The results of Example 6 are shown in Table I.

In this Example, the green multi-layer laminated structure was sintered while being attached to the metal core via the bond glass layer, and the temperature range where the bond glass layer bonded to the glass-ceramic substrate was at about 550–600° C. In view of these elevated co-firing temperatures (compared to that of Example 5), the TEC measured from room temperature to 600° C. is a more critical TEC value.

The glass-ceramic of Example 6 had an $\alpha_{RT-600}$ of about 5.95 ppm/° C., which did not closely match the that of the Ni-plated laminated Cu/Mo/Cu core, which had an $\alpha_{RT-600}$ of about 5.75 ppm/° C. This is enough of a mismatch to cause bowing of several tenths of an inch over a three inch long part, for example, which makes it difficult to mount the part properly in a vacuum chuck during the required dicing or singulation process. In fact, when a bowed part is flattened in the chuck, the glass-ceramic can fracture, especially if it includes cavities for mounting active components or has other structures that result in thin ceramic webs on the metal core. In fact, the assembly of Example 6 bowed toward the higher TEC glass-ceramic substrate, which is not desirable.

EXAMPLES 7-1 to 7-4

Ceramic packaging assemblies were produced as follows. The glass-ceramic powder of Example 1 was prepared and mixed with varying amounts of cordierite as shown in Table I at the tape slurry preparation stage, prior to forming the green tapes. The cordierite had an average particle size of 1 μm. The green multi-layer laminated structures of Examples 7-1 to 7-4 were then formed according to the process described above in connection with Example 4-1, and were bonded to Ni-plated, laminated Cu/Mo/Cu cores in the same manner as described above in connection with Example 6. The results are shown in Table I.

As shown, adding cordierite to the glass-ceramic powder at the tape slurry preparation stage before forming the green tapes decreased the TEC of the glass-ceramic. In Examples 7-1 and 7-2, a sufficient amount of cordierite was not added, however, and the resulting assemblies still exhibited slight bowing toward the higher TEC glass-ceramic substrate. In Example 7-3, 8% cordierite was added to the glass-ceramic powder of Example 1 during the tape slurry preparation stage, and this produced a flat assembly. The composition Example 7-4 included too much cordierite, and the assembly exhibited bowing in the opposite direction, that is, toward the Cu/Mo/Cu core, because the TEC of the glass-ceramic substrate was reduced too much.

EXAMPLE 8

A ceramic packaging assembly was formed in the following manner. Instead of the Ni-plated, laminated Cu/Mo/Cu core described above in Examples 6 and 7-1 to 7-4, a Ni-plated Cu/Mo/Cu core (containing about 30% copper) formed by powder metallurgy techniques was used as the support core for the ceramic package of Example 8. The $\alpha_{RT-300}$ of the Ni-plated, powder metallurgy Cu/Mo/Cu core (hereinafter referred to as "Cu/Mo/Cu core #2") is 7.9, and the $\alpha_{RT-600}$ of the Ni-plated Cu/Mo/Cu core #2 is 7.4. The Cu/Mo/Cu core #2 was plated with Ni, oxidized, coated with the bond glass, heated and coated with the organic adhesive as described above in Example 6.

Since the overall TEC of the Ni-plated Cu/Mo/Cu core #2 is greater than that of the glass-ceramic substrate laminated thereon, the composition of the glass-ceramic of Example 1 was modified to tailor the TEC to be more compatible with that of the Ni-plated Cu/Mo/Cu core #2. In Example 8, an additive of 2 wt % cordierite and 8 wt % quartz was added to the glass-ceramic powder of Example 1 at the tape slurry preparation stage. The added cordierite had an average particle size of 1 μm and the added quartz had an average particle size of 3 μm. A multi-layer green laminated structure was formed as described in Example 4-1, and the laminated multi-layer green structure was positioned on the Ni-coated metal core #2. Like Example 6, the assembly was fired to a temperature of about 900° C. for 10–15 minutes and then cooled. The results are shown in Table I.

As shown, adding quartz to increase the TEC of the glass-ceramic substrate, and adding cordierite to temper the TEC-increasing power of the quartz and reduce the dielectric constant (K), produced an assembly with good bonding and no substantial defects, such as cracking.

EXAMPLE 9

A laminated multi-layer green structure, having the composition shown in Table I, and a Ni-plated Cu/Mo/Cu core #2, as described in Example 8, were used to form a ceramic packaging assembly. The glass-ceramic powder of Example 9 was produced according to the same method described above in connection with Example 1. The glass-ceramic of Example 9 included a mixture of SrO and BaO, but did not include ZnO.

Since the TEC of the glass-ceramic powder of Example 9 is higher than the TEC of the Ni-plated Cu/Mo/Cu core #2, 10 wt % cordierite was added to the glass-ceramic powder at the tape slurry preparation stage to reduce the TEC (and also reduce the dielectric constant (K)) of the glass-ceramic of Example 9.

The assembly of Example 9 was produced as described in connection with Example 8, and the resultant ceramic packaging assembly was flat and well bonded.

Comparative Example

A glass-ceramic substrate having the composition shown in Table I was produced according to the steps outlined in Example 4-1. XRD analysis indicated that anorthite (CaO—Al$_2$O$_3$-2SiO$_2$) was the primary crystal phase for this comparative example composition. The high frequency loss properties of anorthite are known to be inferior to those of the primary crystal phases present in the above-described glass-ceramic compositions of Examples 1-3, for example.

As shown in Table I, the glass-ceramic of the Comparative Example had an extremely low Q value of 135, which is far below the desired Q of at least 400, more preferably 500, and even more preferably 550.

TABLE I

| GLASS-CERAMIC COMPOSITION | Example 1 | Example 2 | Example 3 | Example 4-1 | Example 4-2 | Example 4-3 | Example 5 | Example 6 |
|---|---|---|---|---|---|---|---|---|
| SiO$_2$ | 47.15 | 44.56 | 50.50 | Same as Example 1 | Same as Example 2 | Same as Example 3 | Same as Example 1 | Same as Example 1 |
| Al$_2$O$_3$ | 15.10 | 14.27 | 16.17 | | | | | |
| MgO | 13.93 | 13.16 | 14.91 | | | | | |
| P$_2$O$_5$ | 2.10 | 1.99 | 2.25 | | | | | |
| B$_2$O$_3$ | 1.04 | 0.98 | 1.11 | | | | | |
| SrO | 20.68 | — | — | | | | | |
| BaO | — | 25.04 | — | | | | | |
| ZnO | — | — | 15.06 | | | | | |
| ADDITIVE | NONE | NONE | NONE | NONE | NONE | NONE | NONE | NONE |
| PROPERTIES 900° C./10 min | — | — | — | | | | Same as Example 1 | Same as Example 1 |
| $\alpha_{RT-300}$ | | | | 5.4 | 5.9 | 3.6 | | |
| K | | | | 6.40 | 6.29 | 5.38 | | |
| Q | | | | 791 | 533 | 413 | | |
| $\alpha_{RT-600}$ | | | | 5.95 | | | | |
| SUBSTRATE TREATMENT; TYPE OF CORE BONDED | — | — | — | — | — | — | metallized substrate; laminated Cu/Mo/Cu core | unmetallized substrate; laminated Cu/Mo/Cu plated with Ni |
| BONDING MATERIAL AND CONDITIONS | — | — | — | — | — | — | Au/Sn solder at ~280° C. | low melting point bond glass ~550–600° C. |
| OBSERVATIONS | — | — | — | — | — | — | good bonding; no warping or defects observed | good bonding but assembly bowed toward the glass-ceramic substrate |

TABLE I-continued

| GLASS-CERAMIC COMPOSITION | Example 7-1 | Example 7-2 | Example 7-3 | Example 7-4 | Example 8 | Example 9 | Comparative Example |
|---|---|---|---|---|---|---|---|
| $SiO_2$ | Same as Example 1 | Same as Example 1 | Same as Example 1 | Same as Example 1 | Same as Example 1 | 46.52 | 52.98 |
| $Al_2O_3$ | | | | | | 15.12 | 16.96 |
| MgO | | | | | | 24.24 | 15.64 |
| $P_2O_5$ | | | | | | — | 2.36 |
| $B_2O_3$ | | | | | | 1.73 | 1.16 |
| SrO | | | | | | 9.86 | — |
| BaO | | | | | | 2.53 | — |
| ZnO | | | | | | — | — |
| CaO | | | | | | — | 10.90 |
| ADDITIVE | 2 wt % cordierite | 6 wt % cordierite | 8 wt % cordierite | 10 wt % cordierite | 2 wt % cordierite 8 wt % quartz | 10 wt % cordierite | NONE |
| PROPERTIES 900° C./10 min | | | | | | | |
| $\alpha_{RT-300}$ | 5.34 | 4.74 | 4.63 | 4.34 | 5.51 | 6.05 | 4.8 |
| K | — | — | 5.95 | — | 5.75 | 6.0 | 6.52 |
| Q | — | — | ~800 | — | ~800 | — | 135 |
| $\alpha_{RT-600}$ | 6.17 | 5.63 | 5.27 | 5.07 | 6.83 | 6.76 | |
| SUBSTRATE TREATMENT; TYPE OF CORE BONDED | Same as Example 6 | Same as Example 6 | Same as Example 6 | Same as Example 6 | unmetallized substrate; Cu/Mo/Cu core #2 | Same as Example 8 | |
| BONDING MATERIAL AND CONDITIONS OBSERVATIONS | Same as Example 6 bowed toward glass-ceramic substrate | Same as Example 6 slightly bowed toward glass-ceramic substrate | Same as Example 6 flat; good bonding; no cracks or defects | Same as Example 6 assembly bowed toward metal core | Same as Example 6 flat; good bonding, no cracks or defects | Same as Example 8 good bonding; flat, no bowing | |

EXAMPLES 10-1 to 10-7

Table II shows the composition and properties of the glass-ceramic of Example 10-1, which has the same composition as the glass-ceramic of Example 3. In Example 10-1, the glass-ceramic powder was prepared according to Example1, and green multi-layer laminated structures were provided according the steps described in Example 4-1, with the exception being the sintering temperatures. That is, the green multi-layered laminated structures of Example 10-1 were sintered at the various sintering temperatures and times shown in Table II.

As shown in Table II, when the glass-ceramic of Example 10-1 was sintered at higher temperatures, the TEC increased and the dielectric constant (K) generally decreased. When sintered at a temperature of 1100° C. for 3 hours, the glass-ceramic of Example 10-1 showed an $\alpha_{RT-300}$ of 19.3 ppm/° C., a dielectric constant (K) of 5.19 and a very high Q of 1124. In Example 10-1, very little, if any, crystalline silica (cristobalite) was present when the glass-ceramic was fired at a temperature of about 900° C. When the glass-ceramic of Example 10-1 was fired at a temperature of about 1100° C., however, XRD analysis showed that cristobalite was present as the main phase.

In Example 10-2, 15 wt % quartz having an average particle size of about 3 μm was added to the glass-ceramic powder of Example 10-1 at the tape slurry preparation stage. The green multi-layered laminated structures were sintered at the various sintering temperatures and times shown in Table II. The characteristics of the glass-ceramic of Example 10-2 are shown in Table II. The glass-ceramic of Example 10-2 also shows that the cristobalite concentration can be enhanced at lower temperatures by adding quartz, which nucleates cristobalite at lower temperatures.

The glass-ceramics of Examples 10-3 and 10-4 were prepared as described above in connection with Example 10-2, except that 3 wt % quartz and 7 wt % quartz having an average particle size of about 3 μm were respectively added to the glass-ceramic powder at the tape slurry preparation stage. The results are shown in Table II.

The compositions of Examples 10-5 to 10-7 are shown in Table II. Green multi-layered laminated structures were formed as described above in Example 10-1, and no additives were added to the glass-ceramic powders at the tape slurry preparation stage. The green multi-layered laminated structures were sintered at the various sintering temperatures and times shown in Table II. As shown, when sintered at 1100° C., the compositions of Examples 10-5 to 10-7 had high TEC values.

In view of the high TEC values, the glass-ceramic powders having the compositions of Examples 10-5 to 10-7 also had acceptable K and Q values (not shown) such that these glass-ceramics could also be used as TEC modifying (i.e., increasing) agents in the manner described above instead of quartz. That is, these compositions can be used as TEC increasing additives for other lower temperature firing glass-ceramics if the glass-ceramic additive composition is first fired at 1000° C.–1100° C. to crystallize into the high expansion phases and are then ground into a powder to be added to the glass-ceramic composition at the tape slurry preparation stage, as described above.

TABLE II

| COMPOSITION | Example 10-1 | Example 10-2 | Example 10-3 | Example 10-4 | Example 10-5 | Example 10-6 | Example 10-7 |
|---|---|---|---|---|---|---|---|
| $SiO_2$ | 50.50 | Same as Example 10-1 | Same as Example 10-1 | Same as Example 10-1 | 48.45 | 49.00 | 53.81 |
| $Al_2O_3$ | 16.17 | | | | 16.12 | 16.30 | 15.74 |
| MgO | 14.91 | | | | 14.86 | 15.04 | 12.45 |
| ZnO | 15.06 | | | | 15.01 | 15.19 | 12.57 |
| $P_2O_5$ | 2.25 | | | | 2.24 | — | 2.19 |
| $B_2O_3$ | 1.11 | | | | 3.32 | 4.47 | 3.24 |
| ADDITIVE | NONE | 15% Quartz | 3% Quartz | 7% Quartz | NONE | NONE | NONE |
| 900° C./10 min | | | | | | | |
| $\alpha_{RT-300}$ | 3.6 | 5.28 | — | — | | | |
| K | 5.4 | 4.71 | 5.27 | 5.26 | | | |
| Q | 413 | 217 | 436 | 817 | | | |
| 950° C./6 hr | | | | | | | |
| $\alpha_{RT-300}$ | 4.5 | 9.26 | | | | | |
| K | 5.5 | 4.6 | | | | | |
| Q | 862 | 494 | | | | | |
| 1000° C./1 hr | | | | | | | |
| $\alpha_{RT-300}$ | 8.9 | 10.45 | — | — | | | |
| K | 5.28 | 4.79 | 5.24 | 5.19 | | | |
| Q | 530 | 462 | 768 | 783 | | | |
| 1100° C./3 hr | | | | | | | |
| $\alpha_{RT-300}$ | 19.3 | 20.75 | | | 20.9 | 15.3 | 22.0 |
| K | 5.19 | 4.73 | | | — | — | — |
| Q | 1124 | 642 | | | — | — | — |

FIG. 1 is a cross-sectional view of a ceramic packaging assembly 1 according to one embodiment of the present invention, specifically, a metallized multi-layer glass-ceramic substrate 10 that is solder bonded to a metal core 2. The ceramic packaging assembly 1 of FIG. 1 includes a glass-ceramic substrate 10, a metal core 2, and a bonding layer 3 disposed between the glass-ceramic substrate 10 and the metal core 2. The ceramic packaging assembly of FIG. 1 can be produced according to Examples 1, 4-1 and 5 described above, wherein a green multi-layer laminated structure (not shown in FIG. 1) is formed and sintered, to the desired processing temperature to achieve sufficient densification of the laminated glass-ceramic green sheet layers and to produce the glass-ceramic substrate 10.

The glass-ceramic substrate 10 is then metallized and etched to define solder bands at least on the joining surface 10a thereof, as described in Example 5. An Au/Sn solder is provided in contact with the solder bands, and the joining surface 10a of the glass-ceramic substrate is brought into contact with the joining surface 2a of the laminated Cu/Mo/Cu metal core 2. The assembly is then heated to a temperature of about 280° C. to reflow the solder and define the bonding layer 3, which joins the glass-ceramic substrate 10 and the metal core 2 at the metallized interface between the respective joining surfaces 10a and 2a thereof to form the ceramic packaging assembly 1.

Figure 2A:
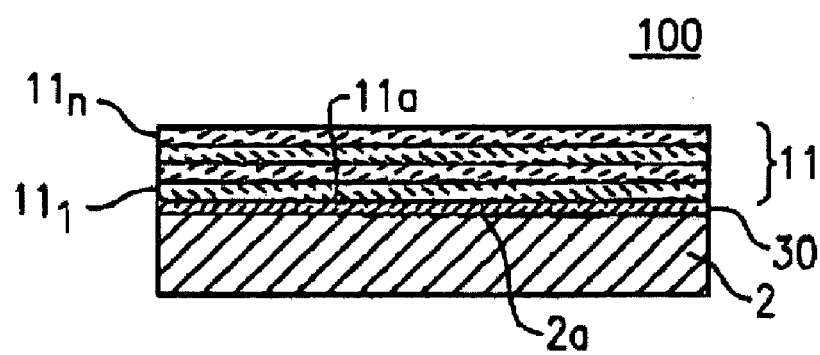
FIG. 2a is a cross-sectional end view of an intermediate stage in preparing an a ceramic packaging assembly.
Figure 2B:
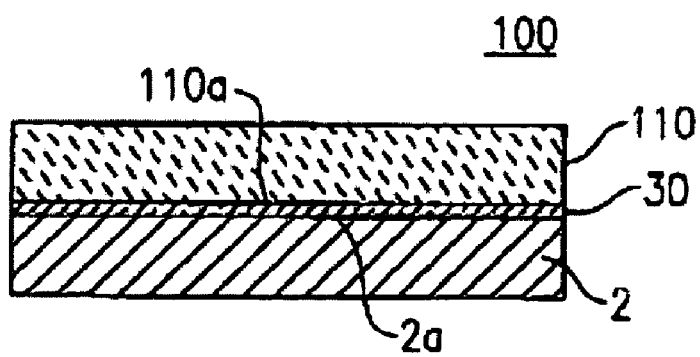

FIG. 2a is a cross-sectional view of an intermediate step in producing a ceramic packaging assembly 100 according to another embodiment of the present invention, specifically involving an non-metallized, green multi-layer laminated structure 11 that is bonded to a Ni-plated metal core 2 via a bond glass layer 30, as described above in Examples 6 and 7-3. FIG. 2b is a cross-sectional end view of the final ceramic packaging assembly 100 of FIG. 2a.

As described above in connection with the Examples, after the glass-ceramic powder of Example 1 is prepared, 8% cordierite is added at the tape slurry preparation stage as described above in Example 7-3. A tape slurry is formed, and a plurality of green sheets are formed as described above in connection with Example 4-1. The green sheets 11-1 . . . 11-n are cut, stacked, and laminated to form the green multi-layer laminated structure 11 of FIG. 2a in the manner described in Example 4-1.

As described in more detail above, and particularly in connection Example 6, the laminated Cu/Mo/Cu core 2 is plated with Ni, oxidized, and a layer of bond glass paste is printed, or otherwise suitably provided, on the joining surface 2a thereof. The bond glass paste is heated to remove organic constituents and to flow into a smooth, adherent bond glass film on the joining surface 2a of the Ni-plated metal core 2. An organic adhesive, such as that described in Example 6, is applied to the bond glass film, and the green laminated structure 11 is disposed so that the joining surface 11a contacts the organic adhesive/bond glass layers on the joining surface 2a of the Ni-coated Cu/Mo/Cu core 2.

The assembly is then heated to a temperature of about 900° C. for 10 minutes to densify the glass-ceramic layers of the green multi-layer laminated structure 11 into the glass-ceramic substrate 110 of FIG. 2b and to allow the bond glass layer 30 to bond the glass-ceramic substrate 110 and the metal core 2 as described above. The glass-ceramic substrate 110 is thus firmly bonded to the Ni-plated, laminated Cu/Mo/Cu core 2 via a bond glass layer 30 interposed between the respective joining surfaces 110a and 2a of the glass-ceramic substrate 110 and the metal core 2 to form the ceramic packaging assembly 100.

Figure 3:
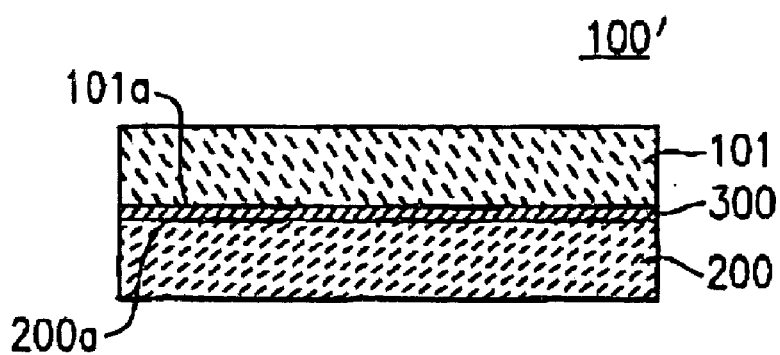
FIG. 3 is a cross-sectional view of a ceramic packaging assembly according to another embodiment of the present invention.

FIG. 3 is a cross-sectional view of a ceramic packaging assembly 100' according to one embodiment of the present invention, specifically, a metallized multi-layer glass-ceramic substrate 101 that is solder bonded to an AlN base member 200. The ceramic packaging assembly 100' of FIG. 3 includes a glass-ceramic substrate 101, an AlN base member 200, and a bonding layer 300 disposed between the glass-ceramic substrate 101 and the base member 200. The glass-ceramic substrate 101 of FIG. 3 can be produced according to Example 4-1 as described above, wherein the green multi-layer laminated structure (not shown in FIG. 3) having the composition of Example 9 is sintered to 900° C. for 10 minutes to achieve sufficient densification of the laminated glass-ceramic green sheet layers to produce the glass-ceramic substrate 101 having the desired Q, K and TEC characteristics.

The glass-ceramic substrate 101 is then metallized and etched to define solder bands at least on the joining surface 101*a* thereof, as described in Example 5. An Au/Sn solder is provided on the solder bands, and the joining surface 101*a* of the glass-ceramic substrate is brought into contact with the joining surface 200*a* of an AlN base member 200. The assembly is then heated to a temperature of about 280° C. to reflow the solder and define the bonding layer 300, which joins the glass-ceramic substrate 101 and the AlN base member 200 at the interface between the respective joining surfaces 101*a* and 200*a* thereof to form the ceramic packaging assembly 100'.

Figure 4A:
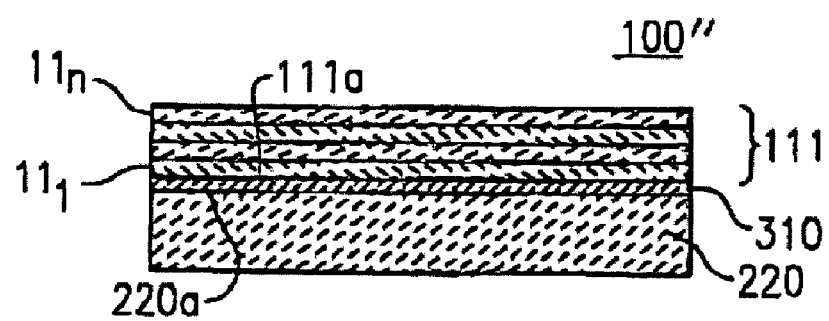
FIG. 4a is a cross-sectional end view of an intermediate stage in preparing an a ceramic packaging assembly according to another embodiment of the present invention.
Figure 4B:
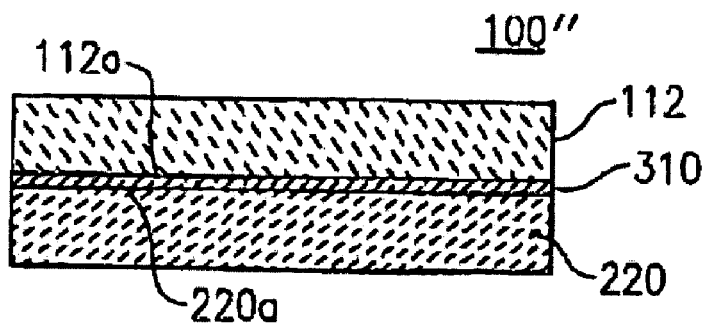

FIG. 4*a* is a cross-sectional view of an intermediate step in producing a ceramic packaging assembly 100" according to another embodiment of the present invention, specifically involving a green multi-layer laminated structure 111 that is bonded to a sintered ceramic core 220 via a bond glass layer 310. FIG. 4*b* is a cross-sectional end view of the final ceramic packaging assembly 100" of FIG. 4*a*.

As described above in connection with the Examples, a glass-ceramic powder having a composition including 45.55 wt % $SiO_2$, 11.76 wt % $Al_2O_3$, 25.9 wt % MgO, 13.9 wt % BaO and 2.88 wt % $B_2O_3$ is prepared, 15 wt % cordierite is added and a tape slurry is formed. A plurality of green sheets are then formed as described above in connection with Example 4-1. The green sheets 11-1 . . . 11-n are cut, stacked, and laminated to form the green multi-layer laminated structure 11 of FIG. 4*a* in the manner described in Example 4-1.

The sintered ceramic core 220 (e.g., $Al_2O_3$) is provided and a layer of bond glass paste is printed, or otherwise suitably provided, on the joining surface 220*a* thereof. The bond glass paste is heated to remove organic constituents and to flow into a smooth, adherent bond glass film on the joining surface 220*a* of the sintered ceramic core 220. An organic adhesive, such as that described in Example 6, is applied to the bond glass film, and the green multi-layer laminated structure 111 is disposed so that the joining surface 111*a* thereof contacts the organic adhesive/bond glass layers on the joining surface 220*a* of the $Al_2O_3$ base member 220.

The assembly is then heated to a temperature of about 900° C. for about 10 minutes to densify the layers of the green multi-layer laminated structure 111 into the glass-ceramic substrate 112 of FIG. 4*b* and to allow the bond glass layer 310 to react with and bond to the glass-ceramic substrate 112 and the core 220 as described above. The glass-ceramic substrate 112 is thus firmly bonded to the $Al_2O_3$ base member 220 via a bond glass layer 310 interposed between the respective joining surfaces 112*a* and 220*a* of the glass-ceramic substrate 112 and the $Al_2O_3$ base member 220 to form the ceramic packaging assembly 100".

While the present invention has been particularly shown and described with reference to the preferred mode as illustrated in the Examples and drawings, it will be understood by one skilled in the art that various changes in detail may be effected therein without departing from the spirit and scope of the invention as defined by the claims.

What is claimed is:

1. A glass-ceramic material consisting essentially of $SiO_2$ in a range of 40 to 55 wt %, $Al_2O_3$ in a range of 7 to 22 wt %, MgO in a range of 6 to less than 26 wt %, and at least one of BaO in an amount up to 35 wt %, SrO in an amount up to 37 wt % and ZnO in an amount up to 17 wt %;

said glass-ceramic material having a thermal expansion coefficient in a range of 4.0 to 8.5 ppm/° C., a dielectric constant in a range of 5–7 and a Quality factor Q of at least 400.

2. The glass-ceramic material of claim 1, wherein said glass-ceramic material further includes at least one of $B_2O_3$ in an amount up to 10 wt % and $P_2O_5$ in an amount up to 4 wt %.

3. The glass-ceramic material of claim 1, wherein said glass-ceramic material further includes a thermal expansion coefficient reducing additive that is added as a particulate after said glass-ceramic material is formed and pulverized into a powder.

4. The glass-ceramic material of claim 1, wherein said glass-ceramic material further includes a thermal expansion coefficient increasing additive that is added as a particulate after said glass-ceramic material is formed and pulverized into a powder.

5. The glass-ceramic material of claim 1, further including 0.1 to 20 wt % of another glass-ceramic material that is added as a particulate to said glass-ceramic material of claim 2 after said glass-ceramic material of claim 2 is formed and pulverized into a powder.

6. An electronic package comprising:

a metal base; and a glass-ceramic substrate bonded to said metal base, said glass-ceramic substrate comprising a glass-ceramic material consisting essentially of $SiO_2$ in a range of 40 to 55 wt %, $Al_2O_3$ in a range of 7 to 22 wt %, MgO in a range of 6 to less than 26 wt %, and at least one of BaO in an amount up to 35 wt %, SrO in an amount up to 37 wt % and ZnO in an amount up to 17 wt %, said glass-ceramic substrate having a thermal expansion coefficient in a range of 4–8.5 ppm/° C., a dielectric constant in a range of 5–7, and a Quality factor (1/loss tangent) Q of at least 400.

7. The electronic package of claim 6, further comprising a bonding layer interposed between said metal base and said glass-ceramic substrate.

8. The electronic package of claim 7, wherein said bonding layer comprises one of a solder and a low melting point glass contacting at least said metal base.

9. The electronic package of claim 6, wherein said glass-ceramic material includes BaO and has a $BaO—Al_2O_3-2SiO_2$ barium aluminosilicate main crystal phase.

10. The electronic package of claim 6, wherein said glass-ceramic material includes SrO and has a $SrO—Al_2O_3-2SiO_2$ strontium alumninosilicate main crystal phase.

11. The electronic package of claim 6, wherein said glass-ceramic material includes ZnO and has a main crystal phase including at least one of zinc aluminosilicate and zinc aluminate.

12. A glass-ceramic material consisting essentially of $SiO_2$ in a range of 47 to 54 wt %, $Al_2O_3$ in a range of 12 to 18 wt %, MgO in a range of 12 to 20 wt %, and ZnO in a range of 5 to 20 wt %, said glass-cerarnic material having a thermal expansion coefficient in a range of 5–22 ppm/° C., a dielectric constant in a range of 4–7 and a Quality factor Q of at least 400.

13. The glass-ceramic material of claim 12, wherein said glass-ceramic material has a main crystal phase comprising at least one of cristobalite, trydimite and quartz.

14. The glass-ceramic material of claim 13, wherein said glass-ceramic material has a thermal expansion coefficient in a range of 10 to 22 ppm/° C.

15. The glass-ceramic material of claim 12, wherein said glass-ceramic material further includes a thermal expansion coefficient increasing material in an amount of 0.1 to 15 wt % that is added as a particulate to said glass-ceramic material after said glass ceramic material is formed and pulverized into a powder.

16. An electronic package comprising:

a base member; and a glass-ceramic substrate comprising a glass-ceramic material consisting essentially of $SiO_2$ in a range of 47 to 54 wt %, $Al_2O_3$ in a range of 12 to 18 wt %, MgO in a range of 12 to 20 wt %, and ZnO in a range of 5 to 20 wt % bonded to said base member, said glass-ceramic material having a thermal expansion coefficient in a range of 5–22 ppm/° C., a dielectric constant in a range of 4–7 and a Quality factor Q of at least 400.

17. An electronic package comprising:

a sintered ceramic base member; and a glass-ceramic substrate comprising a glass-ceramic material consisting essentially of $SiO_2$ in a range of 40 to 55 wt %, $Al_2O_3$ in a range of 7 to 22 wt %, MgO in a range of 6 to less tan 26 wt %, and at least one of BaO in an amount up to 35 wt %, SrO in an amount up to 37 wt % and ZnO in an amount up to 17 wt % bonded to said sintered ceramic base member, said glass-ceramic substrate having a thermal expansion coefficient in a range of 4.0 to 8.5 ppm/° C., a dielectric constant in a range of 5–7 and a Quality factor Q of at least 400.

* * * * *

UNITED STATES PATENT AND TRADEMARK OFFICE
CERTIFICATE OF CORRECTION

PATENT NO. : 7,186,461 B2 Page 1 of 1
APPLICATION NO. : 11/084718
DATED : March 6, 2007
INVENTOR(S) : Robert A. Rita It is certified that error appears in the above-identified patent and that said Letters Patent is hereby corrected as shown below:

<u>Column 24</u>
    *Line 28*: please change both occurrences of "2" to --1--
    *Line 54*: please change "alumninosilicate" to --aluminosilicate--

<u>Column 26</u>
    *Line 9*: please change "tan" to --than--

Signed and Sealed this

Eighth Day of May, 2007

JON W. DUDAS
*Director of the United States Patent and Trademark Office*